(12) United States Patent
Takeno et al.

(10) Patent No.: US 7,749,861 B2
(45) Date of Patent: Jul. 6, 2010

(54) METHOD FOR MANUFACTURING SOI SUBSTRATE AND SOI SUBSTRATE

(75) Inventors: Hiroshi Takeno, Gunma (JP); Nobuhiko Noto, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 122 days.

(21) Appl. No.: 12/086,009

(22) PCT Filed: Oct. 20, 2006

(86) PCT No.: PCT/JP2006/320912

§ 371 (c)(1),
(2), (4) Date: Jun. 4, 2008

(87) PCT Pub. No.: WO2007/072624

PCT Pub. Date: Jun. 28, 2007

(65) Prior Publication Data

US 2009/0042361 A1    Feb. 12, 2009

(30) Foreign Application Priority Data

Dec. 19, 2005   (JP) .............................. 2005-364916

(51) Int. Cl.
*H01L 21/46* (2006.01)
*H01L 21/30* (2006.01)
*H01L 21/76* (2006.01)
*H01L 21/42* (2006.01)
*H01L 21/477* (2006.01)

(52) U.S. Cl. .................... 438/455; 438/406; 438/795

(58) Field of Classification Search ................. 438/406, 438/455, 795
See application file for complete search history.

(56) References Cited

U.S. PATENT DOCUMENTS 5,891,265 A * 4/1999 Nakai et al. ................ 148/33.3
6,403,450 B1   6/2002 Maleville et al.

(Continued)

FOREIGN PATENT DOCUMENTS

CN          1672261 A      9/2005

(Continued)

*Primary Examiner*—Luan C Thai
(74) *Attorney, Agent, or Firm*—Oliff & Berridge, PLC (57) ABSTRACT

According to the present invention, there is provided a method for manufacturing an SOI substrate based on a bonding method, comprising at least: forming a silicon oxide film on a surface of at least one of a single-crystal silicon substrate that becomes an SOI layer and a single-crystal silicon substrate that becomes a support substrate; bonding the single-crystal silicon substrate that becomes the SOI layer to the single-crystal silicon substrate that becomes the support substrate through the silicon oxide film; and performing a heat treatment for holding at a temperature falling within the range of at least 950° C. to 1100° C. and then carrying out a heat treatment at a temperature higher than 1100° C. when effecting a bonding heat treatment for increasing bonding strength. As a result, there are provided the method for manufacturing an SOI substrate that can efficiently manufacture an SOI substrate having an excellent gettering ability with respect to metal contamination in an SOI layer, and the SOI substrate.

8 Claims, 6 Drawing Sheets

U.S. PATENT DOCUMENTS

| | | | |
|---|---|---|---|
| 6,534,384 B2 | 3/2003 | Nakano et al. | |
| 6,602,761 B2 * | 8/2003 | Fukunaga | 438/459 |
| 6,639,327 B2 | 10/2003 | Momoi et al. | |
| 7,442,992 B2 * | 10/2008 | Tomita et al. | 257/347 |
| 2001/0055863 A1 | 12/2001 | Nakano et al. | |
| 2002/0024152 A1 | 2/2002 | Momoi et al. | |
| 2006/0040469 A1 | 2/2006 | Aga et al. | |
| 2006/0118935 A1 | 6/2006 | Kamiyama et al. | |

FOREIGN PATENT DOCUMENTS

| | | |
|---|---|---|
| JP | A-06-163862 | 6/1994 |
| JP | A-06-275525 | 9/1994 |
| JP | A-08-078646 | 3/1996 |
| JP | A-10-032209 | 2/1998 |
| JP | A-11-354760 | 12/1999 |
| JP | A-2002-503400 | 1/2002 |
| JP | A-2002-359247 | 12/2002 |
| JP | A-2004-311526 | 4/2004 |
| JP | A-2006-278893 | 10/2006 |
| WO | WO 99/52145 A1 | 10/1999 |

* cited by examiner

METHOD FOR MANUFACTURING SOI SUBSTRATE AND SOI SUBSTRATE

TECHNICAL FIELD

The present invention relates to a method for manufacturing an SOI (Silicon On Insulator) substrate based on a bonding method, and more particularly to a method for manufacturing an SOI substrate having an excellent gettering ability with respect to a metal impurity.

BACKGROUND ART

As one of semiconductor device substrates, there is an SOI substrate having a silicon layer (which may be referred to as an SOI layer hereinafter) formed on a silicon oxide film as an insulator film. This SOI substrate has characteristics such as a small parasitic capacitance or a high radiation-proof ability since the SOI layer in a substrate surface layer portion serving as a device fabrication region is electrically isolated from the inside of a substrate by a buried oxide film layer (a BOX layer). Therefore, effects such as a high speed/low power consumption operation or prevention of soft-error can be expected, and this substrate has promise as a high-performance semiconductor device substrate.

As a method for manufacturing this SOI substrate, the following method is known, for example. That is, two mirror-polished single-crystal silicon substrates (a single-crystal silicon substrate that becomes an SOI layer (a bond wafer) and a single-crystal silicon substrate that becomes a support substrate (a base wafer)) are prepared, and an oxide film is formed on a surface of at least one silicon substrate. Further, these single-crystal silicon substrates are bonded to each other via the oxide film therebetween, and then a heat treatment is carried out to increase bonding strength. Then, a film thickness of the bond wafer is reduced to obtain an SOI substrate having an SOI (Silicon On Insulator) layer formed therein. As a method for this film thickness reduction, there is, e.g., a method for grinding or polishing the bond wafer until a desired thickness is obtained, or a method for delaminating the bond wafer at an ion implanted layer based on a method called an ion implantation and delamination method.

As explained above, the SOI substrate has many structural merits in view of electrical characteristics but has structural demerits in terms of resistance against metal impurity contamination.

That is, in many cases, a diffusion rate of a metal impurity is slow in the silicon oxide film rather than in silicon. Therefore, when contamination spreads from a surface of the SOI layer, the metal impurity hardly passes through the BOX layer, and hence it is stored in the thin SOI layer. Therefore, a harmful effect of the metal contamination becomes more serious as compared with that in a silicon substrate having no SOI structure. Therefore, in case of the SOI substrate, having an ability of capturing the metal impurity and removing it from a region serving as an active layer of a semiconductor device (a gettering ability) is one of more important qualities.

According to gettering techniques (e.g., oxide precipitates, high-concentration boron addition, or a polysilicon film on a back surface) that are generally used in case of a silicon substrate having no SOI substrate, a gettering layer is introduced on a substrate side opposite to an active layer. However, even if the same techniques are used to introduce the gettering layer on a support substrate side in the SOI substrate, since a metal impurity hardly passes through the BOX layer, there is a problem that the gettering layer does not sufficiently function, and these techniques cannot be applied to the SOI substrate as they are.

To solve such problems, several methods for introducing a gettering region near an SOI layer of an SOI substrate have been conventionally proposed.

For example, Japanese Patent Application Laid-open No. 1994-163862 or Japanese Patent Application Laid-open No. 1998-32209 discloses a method for providing a region containing an impurity such as phosphorus or boron at a high concentration for gettering. However, such a method has a problem that an increase in the number of processing steps of introducing the impurity results in a rise in cost and a reduction in productivity. Furthermore, when the impurity introduced for gettering diffuses to reach an active layer of a semiconductor device due to a heat treatment in a manufacturing process of the SOI substrate or in a device process, a harmful effect on electrical characteristics is concerned.

Moreover, as another method, Japanese Patent Application Laid-open No: 1994-275525 discloses a method for forming a polysilicon layer in an SOI layer region near an interface between an SOI layer and a BOX layer to getter a metal impurity. However, this method likewise has a problem that an increase in the number of processing steps of forming the polysilicon layer results in a rise in a cost and a reduction in productivity. Additionally, when a thickness of the SOI layer is small, forming the polysilicon layer is very difficult.

DISCLOSURE OF INVENTION

In view of the above-explained problems, it is an object of the present invention to provide a method for manufacturing an SOI substrate that can efficiently manufacture the SOI substrate having an excellent gettering ability with respect to metal contamination of an SOI layer and to provide the SOI substrate.

To achieve this object, according to the present invention, there is provided a method for manufacturing an SOI substrate based on a bonding method, comprising at least: forming a silicon oxide film on a surface of at least one of a single-crystal silicon substrate that becomes an SOI layer and a single-crystal silicon substrate that becomes a support substrate; bonding the single-crystal silicon substrate that becomes the SOI layer to the single-crystal silicon substrate that becomes the support substrate through the silicon oxide film; and performing a heat treatment for holding at a temperature falling within the range of at least 950° C. to 1100° C. and then carrying out a heat treatment at a temperature higher than 1100° C. when effecting a bonding heat treatment for increasing bonding strength.

When the heat treatment for holding at a temperature in the range of at least 950° C. to 1100° C. is performed and then the heat treatment at a temperature higher than 1100° C. is carried out in this manner, the excellent gettering ability can be added to the bonding interface region, and the SOI substrate having high bonding strength can be manufactured. Further, since a new special processing step is not added, the SOI substrate can be efficiently manufactured without reducing productivity and increasing a cost. Furthermore, since provision of a high-concentration layer of an impurity and others are not required, other electrical characteristics are not degraded, for example.

Moreover, in the method for manufacturing an SOI substrate according to the present invention, it is preferable to form the silicon oxide film on a surface of the single-crystal silicon substrate that becomes the support substrate.

When the silicon oxide film is formed on the surface of the single-crystal silicon substrate that becomes the support substrate, the bonding interface serving as a gettering site becomes an interface between the SOI layer and the BOX layer, thereby manufacturing the SOI substrate that can getter the metal contamination in the SOI layer without passing it through the BOX layer.

Additionally, in the method for manufacturing an SOI substrate according to the present invention, it is preferable to set a time for holding at the temperature in the range of 950° C. to 1100° C. to the range of 1 hour to 4 hours.

When the time for holding at the temperature in the range of 950° C. to 1100° C. is set to the range of 1 hour to 4 hours in this manner, the sufficient gettering ability can be obtained without reducing productivity.

Further, in the method for manufacturing an SOI substrate according to the present invention, it is preferable that the heat treatment for increasing bonding strength includes a heat treatment in an atmosphere containing water vapor.

As explained above, if the heat treatment atmosphere in at least some of processing steps of the heat treatments is the atmosphere containing water vapor when the heat treatment for holding at the temperature in the range of at least 950° C. to 1100° C. is performed and then the heat treatment at the temperature higher than 1100° C. is carried out as the heat treatment for increasing bonding strength, the gettering ability can be further improved.

Further, according to the present invention, there is provided an SOI substrate manufactured based on a bonding method, wherein the SOI substrate has an SOI layer consisting of single-crystal silicon alone and has an ability of capturing a metal impurity of $1 \times 10^{12}$ atoms/cm$^2$ or above based on an bonding interface defect in an interface region between the SOI layer and a buried oxide film in the SOI layer.

It is known that a concentration of a metal impurity that affects electrical characteristics is $10^{11}$ atoms/cm$^2$ level or above. Therefore, when the interface region between the SOI layer and the buried oxide film has the gettering ability of $1 \times 10^{12}$ atoms/cm$^2$ or above like the SOI substrate according to the present invention, degradation in device characteristics due to metal contamination can be sufficiently avoided.

The method for manufacturing an SOI substrate according to the present invention can efficiently manufacture the SOI substrate having the excellent gettering ability with respect to metal contamination in the SOI layer at a low cost. Furthermore, the SOI substrate according to the present invention can be a high-quality and inexpensive SOI substrate having the sufficiently high gettering ability in an SOI layer.

BEST MODE(S) FOR CARRYING OUT THE INVENTION

The present invention will now be explained hereinafter in detail with reference to the drawings, but the present invention is not restricted thereto.

Figure 1:
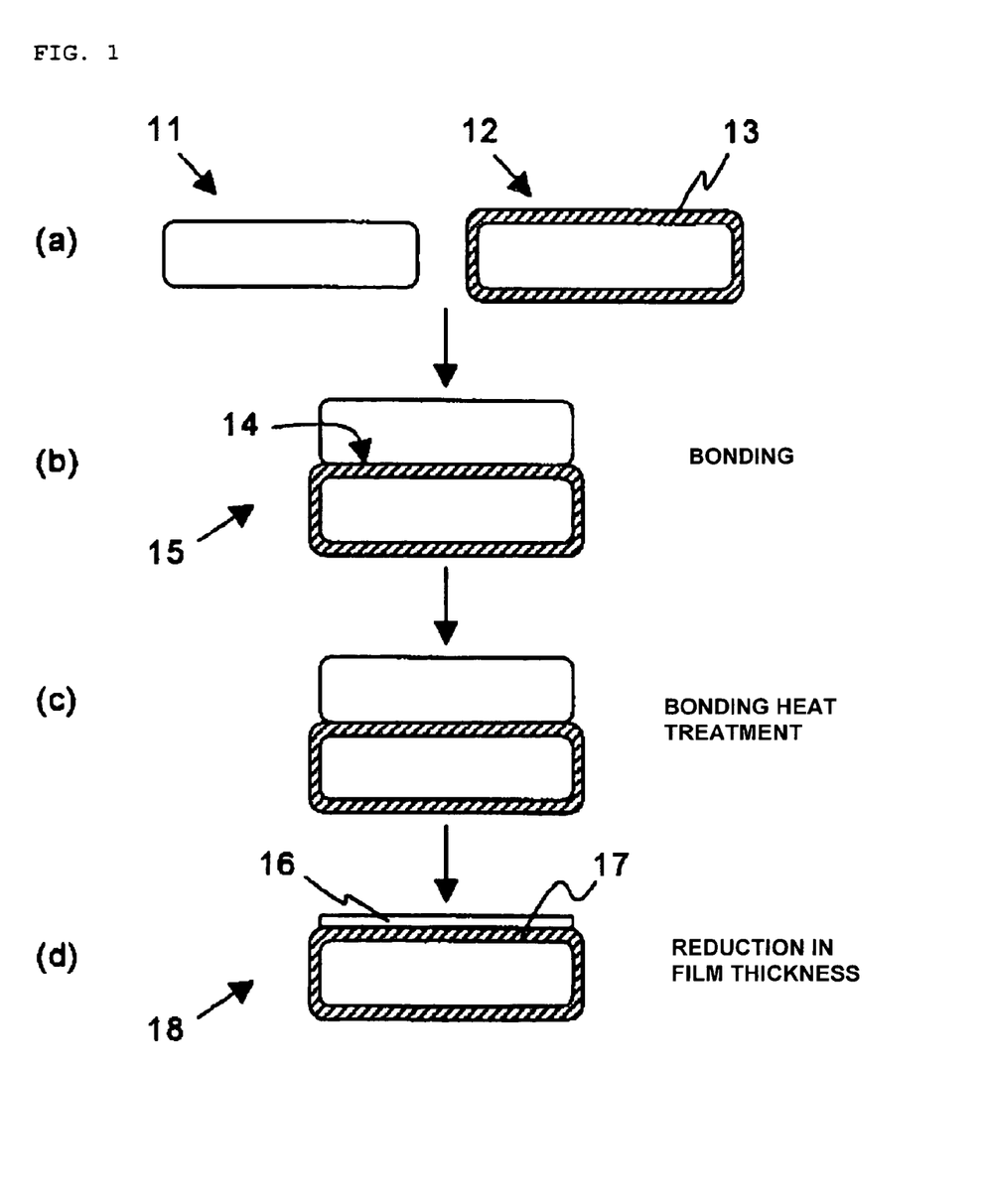
FIG. 1 is a flow sheet showing an outline of a method for manufacturing an SOI substrate based on a bonding method.

FIG. 1 is a flow sheet showing an example of a method for manufacturing an SOI substrate based on a bonding method. An outline of the method for manufacturing an SOI substrate based on the bonding method to which the present invention is applied is as follows.

First, at a step (a), a single-crystal silicon substrate (a bond wafer) 11 that becomes an SOI layer for formation of a semiconductor device and a single-crystal silicon substrate (a base wafer) 12 that becomes a support substrate are prepared, and a silicon oxide film 13 that becomes a BOX layer is formed on a surface of at least one of the single-crystal silicon substrates (here, the oxide film 13 is formed on the base wafer).

Then, at a step (b), the single-crystal silicon substrate 11 that becomes the SOI layer is closely contacted with and bonded to the single-crystal silicon substrate 12 that becomes the support substrate via the silicon oxide film 13 therebetween. In this manner, a bonded wafer 15 having a bonding surface 14 is obtained.

Subsequently, at a step (c), a bonding heat treatment for increasing bonding strength is carried out.

Then, at a step (d), a film thickness of the SOI layer is reduced until a desired thickness can be obtained, thereby obtaining an SOI substrate 18 having an SOI layer 16 and a buried oxide film (the BOX layer) 17.

As the film thickness reduction at this time, it is possible to use a method based on surface grinding and mirror polishing, or use a method called an ion implantation and delamination method for previously implanting a hydrogen gas or a rare gas ion into the bonding surface of the bond wafer to form an ion implanted layer before a step (b) of bonding the bond wafer to the base wafer and then delaminating the bond wafer at the ion implanted layer after bonding, thereby reducing a film thickness. It is to be noted that, when the film thickness reduction is carried out based on the ion implantation and delamination method, bonding is effected at a room temperature, then a low-temperature heat treatment at approximately 500° C. is performed as required to carry out delamination, and thereafter the bonding heat treatment step (c) is performed to increase bonding strength in this process order.

The present inventors have keenly examined a method for directly adding a gettering ability to the SOI layer without adding a special processing step, e.g., formation of a high-concentration impurity region or formation of a polysilicon layer in the method for manufacturing an SOI substrate based on such a bonding method, and they have conceived utilizing a bonding interface itself as a gettering site and discovered that devising bonding heat treatment conditions enables adding the gettering ability to the bonding interface region. That is, they have revealed that heating temperature conditions at the time of the bonding heat treatment concern generation of the gettering site, thereby bringing the present invention to completion.

EXPERIMENTAL EXAMPLE

The present inventors have considered that optimizing a heating temperature at the time of the bonding heat treatment enables improving the gettering ability of a finally manufactured SOI substrate, and conducted the following experiment.

An experimental example will now be explained with reference to FIG. 1.

First, two mirror-polished N-type single-crystal silicon substrates each having a diameter of 200 mm and a plane orientation of {100} were prepared. A silicon oxide film 13 serving as a BOX layer and having a film thickness of approximately 1 μm was formed on a surface of a single-crystal silicon substrate 12 functioning as a support substrate based on a thermal oxidation (a). Then, a single-crystal silicon substrate 11 serving as an SOI layer was closely contacted with and bonded to the single-crystal silicon substrate 12 functioning as the support substrate via the silicon oxide film 13 therebetween (b).

Subsequently, a bonding heat treatment for increasing bonding strength was performed under the following conditions (c). That is, a bonded wafer was put into a heat treatment furnace set to 800° C., a temperature was increased to a maximum temperature $T_1$° C. at a rate of temperature increase of 10° C./minute and held for 2 hours, then the temperature was reduced to 800° C., and the wafer was taken out to the outside of the heat treatment furnace. $T_1$° C. was set to 1050° C., 1100° C., 1150° C., and 1200° C., and the temperature was not held in particular during temperature rising.

At this time, a heat treatment atmosphere at the bonding heat treatment step was a dry oxygen atmosphere in a period from putting the wafer into the furnace at 800° C. to 900° C. in the temperature increase process, pyrogenic oxidation (i.e., an atmosphere containing water vapor) was performed in the temperature increase process from 900° C. to $T_1$° C. and up to the middle of the temperature decrease process after holding at $T_1$° C. for 2 hours, and then a dry oxygen atmosphere was adopted until the wafer was taken out at 800° C.

Subsequently, an active layer side of a bonded wafer 15 was subjected to film thickness reduction based on surface grinding or mirror polishing until a thickness of approximately 12 μm was obtained, thereby acquiring an SOI substrate 18 (d).

A gettering ability of the thus fabricated SOI substrate was evaluated as follows. First, Ni was applied to a surface of the SOI layer at a concentration of approximately $1 \times 10^{13}$ atoms/cm² and diffused inside by performing a heat treatment at 1000° C. for one hour. Then, the surface oxide film, the SOI layer, and the BOX layer were gradually etched, and an Ni concentration in a liquid solution was measured based on ICP-MS (inductively-coupled plasma mass spectrometry), thereby measuring a distribution of the Ni concentration in a depth direction. Each of the surface oxide film and the BOX layer was measured on one stage using HF liquid solution, and the SOI layer was measured on six stages in increments of approximately 2 μm from a surface of the SOI layer.

Figure 2:
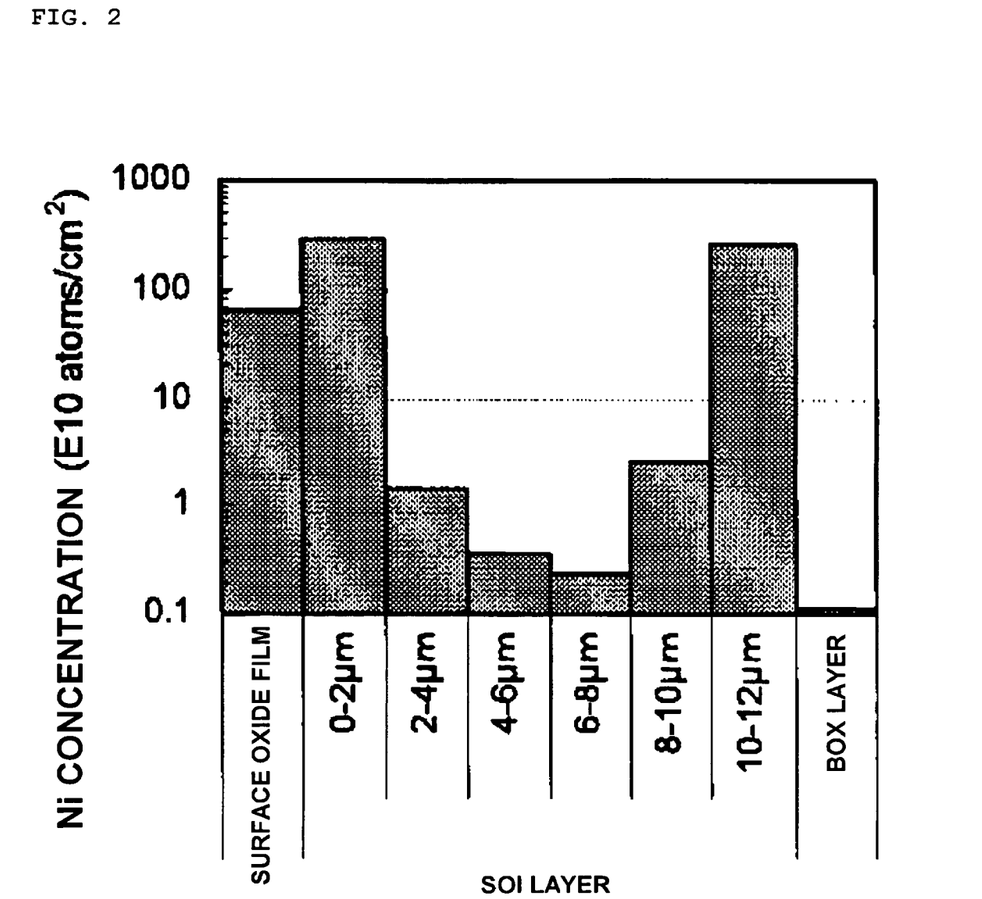
FIG. 2 is a graph showing an example of a concentration distribution of a metal impurity from a surface on an SOI layer side to a BOX layer in an SOI substrate in an experimental example.

FIG. 2 shows an example of a measurement result of the Ni concentration distribution in the depth direction. Referring to FIG. 2, it can be understood that the Ni concentration in the SOI layer is high both in the Ni-contaminated surface layer and in a region of 10 to 12 μm that is an interface region of the SOI layer and the BOX layer. That is, the Ni concentration in the region of 10 to 12 μm in the SOI layer depicted in FIG. 2 can be regarded as an Ni concentration gettered in a bonding interface region. Table 1 shows an evaluation result of the experimental example. An Ni concentration in Table 1 means the Ni concentration gettered in the bonding interface region.

TABLE 1

| Maximum temperature $T_1$ (° C.) | Ni concentration (atoms/cm²) |
|---|---|
| 1050 | $2.6 \times 10^{12}$ |
| 1100 | $1.6 \times 10^{12}$ |
| 1150 | $3.9 \times 10^{11}$ |
| 1200 | $3.7 \times 10^{11}$ |

It can be understood from the result depicted in Table 1 that the Ni concentration in the bonding interface region is higher in a case where a maximum temperature of the bonding heat treatment is 1050° C. and 1100° C. than that in a case where the same is 1150° C. and 1200° C. That is, it can be comprehended that the better gettering ability is given to the bonding interface region when the temperature is held at 1100° C. or below in the bonding heat treatment.

It can be understood from the above-explained result that, when performing the bonding heat treatment for increasing bonding strength at the step (c) in FIG. 1, setting the maximum temperature in the bonding heat treatment to 1100° C. or a lower temperature enables adding the excellent gettering ability to the bonding interface region.

It is to be noted that the holding time at the maximum temperature is 2 hours in the experimental example, but it is not restricted in particular, and the same effect can be obtained when the holding time is set to approximately 1 hour to 4 hours or more as required.

Although the detail of a reason that the gettering ability is added to the bonding interface region when the temperature in the heat treatment is set to a low temperature as explained above is not clear, it can be considered that a bonding state of the bonding interface or any defect produced due to this state serves as a gettering site. It can be considered that, when the heating temperature is higher than 1100° C., bonding with higher completeness can be effected, and a defect that becomes a gettering site is not formed or annihilated.

It was revealed from the result of the experimental example that performing the bonding heat treatment at a temperature equal to or lower than 1100° C. enables adding the excellent gettering ability to the bonding interface region. However, the SOI substrate subjected to the bonding heat treatment at a temperature equal to or lower than 1100° C., especially equal to or below 1050° C. in this manner has lower bonding strength than the SOI substrate subjected to the bonding heat treatment at a temperature higher than 1100° C. and, when such a substrate is subjected to a device process, a yield ratio may be possibly reduced due to, e.g., delamination of the SOI layer. Thus, the present inventors have keenly performed examination and review in order to discover a method for obtaining higher bonding strength while maintaining the excellent gettering ability in the bonding interface region.

As a result, they have found that performing a heat treatment at a high temperature after effecting a heat treatment at a lower temperature equal to or below 1100° C. as the bonding heat treatment enables providing strong bonding force and controlling generation of a gettering site.

Specifically, in such a method for manufacturing an SOI substrate as depicted in FIG. 1, when the following heat treatment on two stages is performed in the bonding heat treatment shown in FIG. 1 (c), the excellent gettering ability can be obtained, and the higher bonding strength can be acquired. That is, a heat treatment on a first stage is a heat treatment for holding at a temperature in the range of at least 950° C. to 1100° C., and a heat treatment on a second stage is a heat treatment at a temperature that is higher than 1100° C. and less than a melting point of silicon. Although a holding time of the heat treatment on the first stage is not restricted in particular, it can be set to, e.g., the range of 1 hour to 4 hours. When the holding time is shorter than 1 hour, the sufficient gettering ability may not be obtained in some cases. When the holding time is longer than 4 hours, productivity is lowered. Further, although a holding time of the heat treatment on the second stage is not likewise restricted in particular, and selecting an appropriate holding time can suffice.

Figure 3:
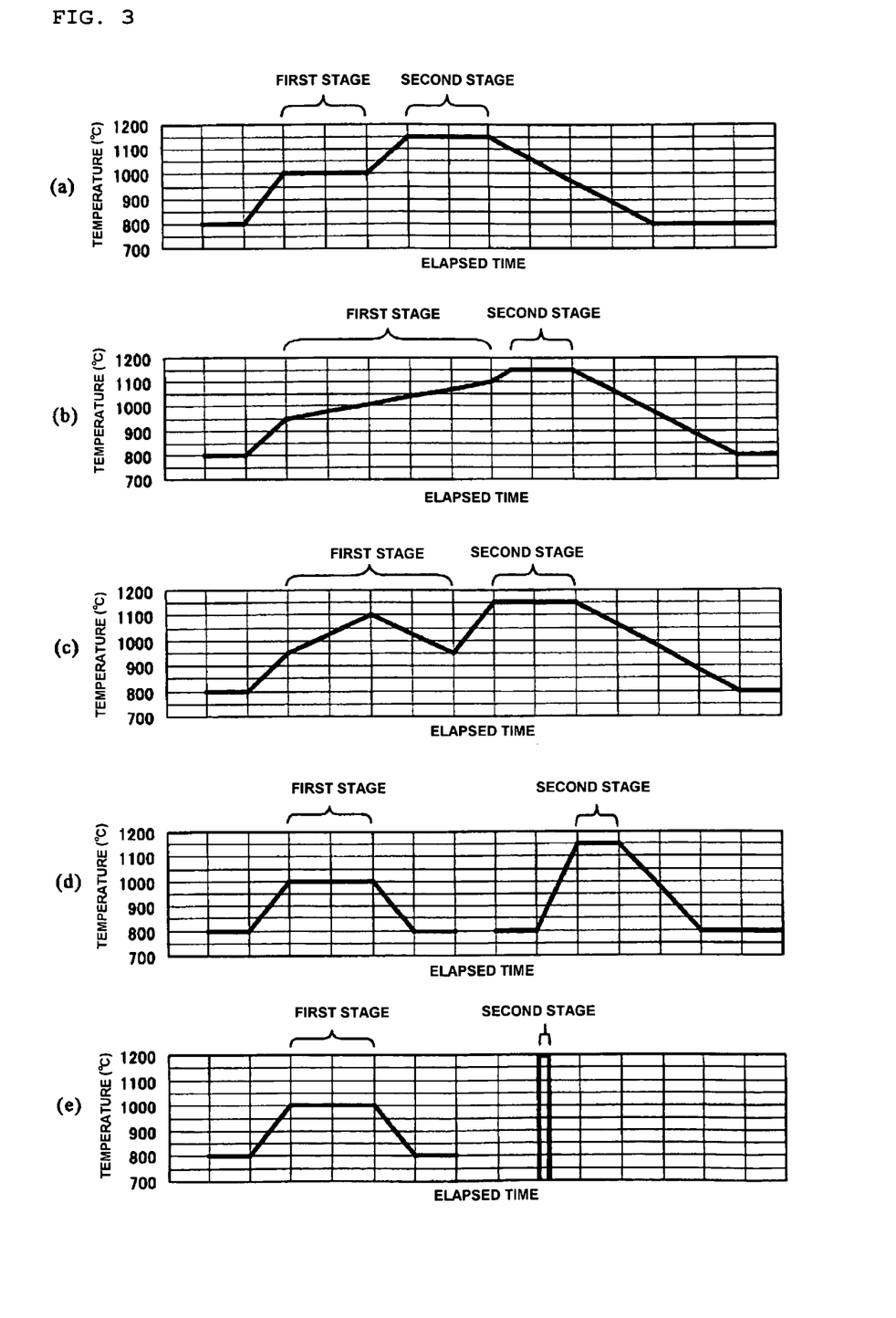
FIG. 3 are schematic views showing examples of change patterns of a temperature at the time of a bonding heat treatment according to the present invention, in which (a) shows a case where a specific temperature is held for a fixed time in a heat treatment on a first stage, (b) shows a case where the heat treatment on the first stage is performed while gradually increasing a temperature, (c) shows a case where a temperature is increased or reduced in the range of 950° C. to 1100° C. in the heat treatment on the first stage, (d) shows a case where a wafer is temporarily taken out after the heat treatment on the first stage, and (e) shows a case where a heat treatment furnace is changed.

It is to be noted that "holding at a temperature in the range of at least 950° C. to 1100° C." usually means holding at a specific temperature (a fixed temperature) in the range of 950° C. to 1100° C., but the present invention is not restricted thereto. That is, holding in the range of 950° C. to 1100° C. can suffice, and these values are included as long as the effect of the present invention can be obtained. For example, there are the following patterns, and FIG. 3 show schematic graphs. That is, it is possible to adopt (a) a method for holding at a specific temperature in the range of 950° C. to 1100° C. for a fixed time, (b) a method for setting a rate of temperature increase in the range of 950° C. to 1100° C. to gradual temperature rising (e.g., less than 10° C./minute) smaller than a rate of temperature increase in the range of a temperature at which the wafer is put into the furnace to 950° C. (e.g., not smaller than 10° C./minute and not greater than 30° C./minute), (c) a method for increasing or reducing a temperature in the range of 950° C. to 1100° C., or a combination of these methods.

However, considering productivity or a cost, the method (a) or (b) is preferable.

Further, the wafer may be temporarily taken out to be, e.g., cleaned after the heat treatment on the first stage and then subjected to the heat treatment on the second stage like (d), or the wafer may be temporarily cooled after the heat treatment on the first stage and then subjected to the heat treatment on the second stage in a different heat treatment furnace like (e). Furthermore, in this case, the heat treatment on the second stage may be performed based on RTA (Rapid Thermal Annealing).

In the method for performing the above-explained bonding heat treatment on the two stages, although a detailed reason that the gettering ability is added is not clear, it can be considered that any defect serving as a gettering site is formed on the bonding interface due to holding at a temperature in the range of 950° C. to 1100° C. on the first stage and this defect is stably maintained without being annihilated in the heat treatment on the second stage at a temperature higher than 1100° C. if the defect is a gettering site formed by holding at a temperature in the range mentioned above.

Adopting the above-explained method enables introducing a gettering layer into the SOI substrate while keeping high bonding strength without adding a special new processing step, e.g., introducing an impurity at a high purity. That is, since a new processing step is not added, the SOI substrate having the high gettering ability can be efficiently manufactured without reducing productivity and increasing a cost.

Moreover, according to the present invention, there is not a harmful effect on a device formation region due to thermal diffusion of an impurity, e.g., phosphorus or boron that is a problem in the method for introducing an impurity such as phosphorus or boron to provide the gettering layer. Additionally, the present invention is also preferable in a case where a method for introducing a gettering layer by forming a polysilicon layer on an interface between an SOI layer and a BOX layer is difficult since a thickness of the SOI layer is small.

Although surface grinding or mirror polishing is effected as a processing step of reducing a film thickness of the bond wafer after bonding in the above example, it is possible to adopt a method called an ion implantation and delamination method for previously implanting a hydrogen ion or a rare gas ion into a surface layer portion of the bond wafer before bonding to form an ion implanted layer, bonding this surface with a surface of a base wafer through an oxide film, and carrying out a heat treatment at a low temperature of approximately 500° C. to realize delamination at the ion implanted layer, thereby forming an SOI layer. Further, at this time, it is also possible to use a method for using a mechanical stress to perform delamination at the ion implanted layer without effecting the heat treatment at approximately 500° C. by activating wafer surfaces to be bonded based on a plasma treatment and bonding the wafers.

In any case, the bonding strength at the bonding interface of the SOI wafer after delamination is insufficient to subject the wafer to a device process, and a heat treatment for increasing the bonding strength must be added. Since adding the heat treatment according to the present invention as the heat treatment in this case enables manufacturing the SOI wafer having the excellent gettering ability in the bonding interface region, the present invention is particularly preferable when film thickness reduction is carried out based on the ion implantation and delamination method.

Meanwhile, in the present invention, the gettering layer is formed near the bonding surface of the single-crystal silicon substrate that becomes the SOI layer and the single-crystal silicon substrate that becomes the support substrate. That is, the gettering layer is formed in the interface region between the BOX layer and the SOI layer when the silicon oxide film is formed on the surface of the single-crystal silicon substrate that becomes the support substrate, and the gettering layer is formed in the interface region of the support substrate and the BOX layer when the silicon oxide film is formed on the surface of the single-crystal silicon substrate that becomes the SOI layer. At this time, since there is no difference in bonded state of the bonding surface between these cases, the gettering layers in both the cases have the same gettering ability.

However, a metal impurity hardly passes through the BOX layer because of a difference between a diffusion rate of the metal impurity in silicon and a diffusion rate of the same in the silicon oxide. Therefore, it is good to form the gettering layer in the interface region of the BOX layer and the SOI layer in order to getter the metal contamination that has adhered to the surface of the SOI layer that becomes a device fabrication region. That is, it is better to form the silicon oxide film on the surface of the single-crystal silicon substrate that becomes the support substrate and then carry out bonding.

However, even when the silicon oxide film is formed on the surface of the single-crystal silicon substrate that becomes the SOI layer and the gettering layer is formed in the interface region of the support substrate and the BOX layer, a larger gettering ability can be obtained as compared with a case where the gettering layer is introduced to the back surface of the SOI substrate. Further, a thickness of the BOX layer in the SOI layer is becoming smaller every year and the SOI layer having such a BOX layer is fabricated. When the thickness of the BOX layer is as small as, e.g., 100 nm or below, even the gettering layer formed in the interface region of the support substrate and the BOX layer is effective to getter the metal contamination in the SOI layer.

According to the above-explained method for manufacturing an SOI substrate based on the bonding method, it is possible to manufacture the SOI substrate having an SOI layer consisting of single-crystal silicon alone and having an ability of capturing a metal impurity of $1\times10^{12}$ atoms/cm$^2$ or above based on a bonding interface defect in the interface region between the SOI layer and the buried oxide film in the SOI layer.

It is known that a concentration of a metal impurity that affects electrical characteristics is $10^{11}$ atoms/cm$^2$ level or above. Therefore, like the present invention, when the gettering ability of $1\times10^{11}$ atoms/cm$^2$ or above, especially the gettering ability of $1\times10^{12}$ atoms/cm$^2$ or above is provided in the interface region of the SOI layer and the buried oxide film, degradation in device characteristics due to the metal contamination in the device formation region in the SOI layer can be effectively avoided.

Furthermore, the SOI substrate that has the SOI layer consisting of single-crystal silicon alone and also has the gettering layer in the SOI layer is superior in electrical characteristics, does not harmfully affect a device, and cannot be obtained by a method for forming, e.g., a high-concentration impurity layer or a polysilicon layer in the SOI layer region near the interface between the SOI layer and the BOX layer.

Although the present invention will now be specifically explained hereinafter with reference to examples of the present invention, the present invention is not restricted thereto.

Example 1

An SOI substrate was fabricated based on the processing steps shown in FIG. 1 as follows.

First, like the experimental example, two mirror-polished N-type single-crystal silicon substrates each having a diameter of 200 mm and a plane orientation of {100} were prepared. A silicon oxide film 13 having a film thickness of approximately 1 μm that becomes a BOX layer was formed on a surface of a single-crystal silicon substrate 12 that becomes a support substrate based on thermal oxidation (a). Then, a single-crystal silicon substrate 11 that becomes an SOI layer was closely contacted with and bonded to the single-crystal silicon substrate 12 that becomes the support substrate via the silicon oxide film 13 therebetween (b).

Subsequently, a bonding heat treatment for increasing bonding strength was carried out (c). A bonded wafer was put into a heat treatment furnace maintained at 800° C., a temperature was increased to a $T_2$° C. as a holding temperature at a rate of temperature increase of 10° C./minute, and then this state was held at $T_2$° C. for 2 hours. Thereafter, the temperature was increased to 1150° C. as a maximum temperature, this state was held for 2 hours, then the temperature was reduced to 800° C., and the wafer was taken out of the furnace. $T_2$° C. was set to 950° C., 1000° C., and 1100° C.

At this time, as a heat treatment atmosphere during the bonding heat treatment process, a dry oxygen atmosphere was adopted in a period from putting the wafer in the furnace at 800° C. to holding at $T_2$° C. for 2 hours via the temperature increase process, pyrogenic oxidation (i.e., an atmosphere containing water vapor) was performed in a period from the temperature increase process from $T_2$° C. to 1150° C. to the middle of the temperature decrease process through holding at 1150° C. for 2 hours, and then a dry oxygen atmosphere was used until the wafer was taken out at 800° C.

Subsequently, a film thickness of an active layer side of the bonded wafer 15 was reduced based on surface grinding or mirror polishing until a thickness of approximately 12 μm was obtained, thereby acquiring an SOI substrate 18 (d).

A gettering ability of the thus fabricated SOI substrate was evaluated by using the same method as that of the experimental example.

Comparative Example 1

An SOI substrate was fabricated in a state where the holding temperature $T_2$° C. in the temperature increase process of the bonding heat treatment in the procedure for fabricating the SOI substrate according to Example 1 was set to 900° C. and 1125° C. Further, its gettering ability was evaluated by using the same method as that of the experimental example.

Table 2 shows evaluation results of the gettering abilities in Example 1 and Comparative Example 1.

TABLE 2

| Holding temperature $T_2$ (° C.) | Ni concentration (atoms/cm$^2$) |
|---|---|
| 900 | $3.9 \times 10^{11}$ |
| 950 | $2.1 \times 10^{12}$ |
| 1000 | $3.0 \times 10^{12}$ |
| 1100 | $1.5 \times 10^{12}$ |
| 1125 | $6.8 \times 10^{11}$ |

As shown in Table 2, it can be understood that an Ni concentration in a bonding interface region is high when the holding temperature $T_2$° C. in the temperature increase process of the bonding heat treatment is 950 to 1100° C. in Example 1 as compared with the case where this temperature is 900° C. and 1125° C. in Comparative Example 1. That is, it can be understood that, even if a maximum temperature is 1150° C. or above, the better gettering ability is added to the bonding interface region when holding is effected at a temperature in the range of 950 to 1100° C. in the temperature increase process. Furthermore, the sufficient ability of gettering Ni of $1\times10^{12}$ atoms/cm$^2$ or above is provided.

Moreover, although the SOI substrate fabricated in each of Example 1 and Comparative Example 1 was subjected to a regular device process, delamination and others did not occur, and bonding strength had no problem.

As explained above, the present invention demonstrated that the SOI substrate having the excellent gettering ability can be efficiently manufactured.

Examples 2 and 3

Each SOI substrate was fabricated based on the processing steps depicted in FIG. 1 as follows.

First, like Example 1, two N-type silicon single-crystal substrates were prepared, and a silicon oxide film 13 having a film thickness of approximately 1.3 μm that becomes a BOX layer was formed on a surface of a single-crystal silicon substrate 12 that becomes a support substrate based on thermal oxidation (a). Then, a single-crystal silicon substrate 11 that becomes an SOI layer and the single-crystal silicon substrate 12 that becomes the support substrate were closely contacted with and bonded to each other via the silicon oxide film 13 therebetween (b). Then, a bonded wafer was put into a heat treatment furnace held at 800° C., a temperature was increased to 1000° C. as a holding temperature at a rate of temperature increase of 10° C./minute, this state was held for 2 hours, then the temperature was increased to 1150° C., this state was maintained for 2 hours, then the temperature was reduced to 800° C., and the wafer was taken out of the furnace.

At this time, as a heat treatment atmosphere in a bonding heat treatment process, a dry oxygen atmosphere was adopted in a period from putting the wafer in the furnace at 800° C. to 900° C. during the temperature increase process, pyrogenic oxidation (i.e., an atmosphere containing water vapor) was carried out in a period from the temperature increase process from 900° C. to 1000° C. to the middle of the temperature decrease process through the respective steps, i.e., holding at 1100° C. for 2 hours, the temperature increase process from 1100° C. to 1150° C., and holding at 1150° C. for 2 hours, and then a dry oxygen atmosphere was used until the wafer was taken out at 800° C. (Example 2), and another type of atmosphere was adopted, namely, a dry oxygen atmosphere was used as a heat treatment atmosphere in the entire bonding heat treatment process (Example 3).

Figure 4:
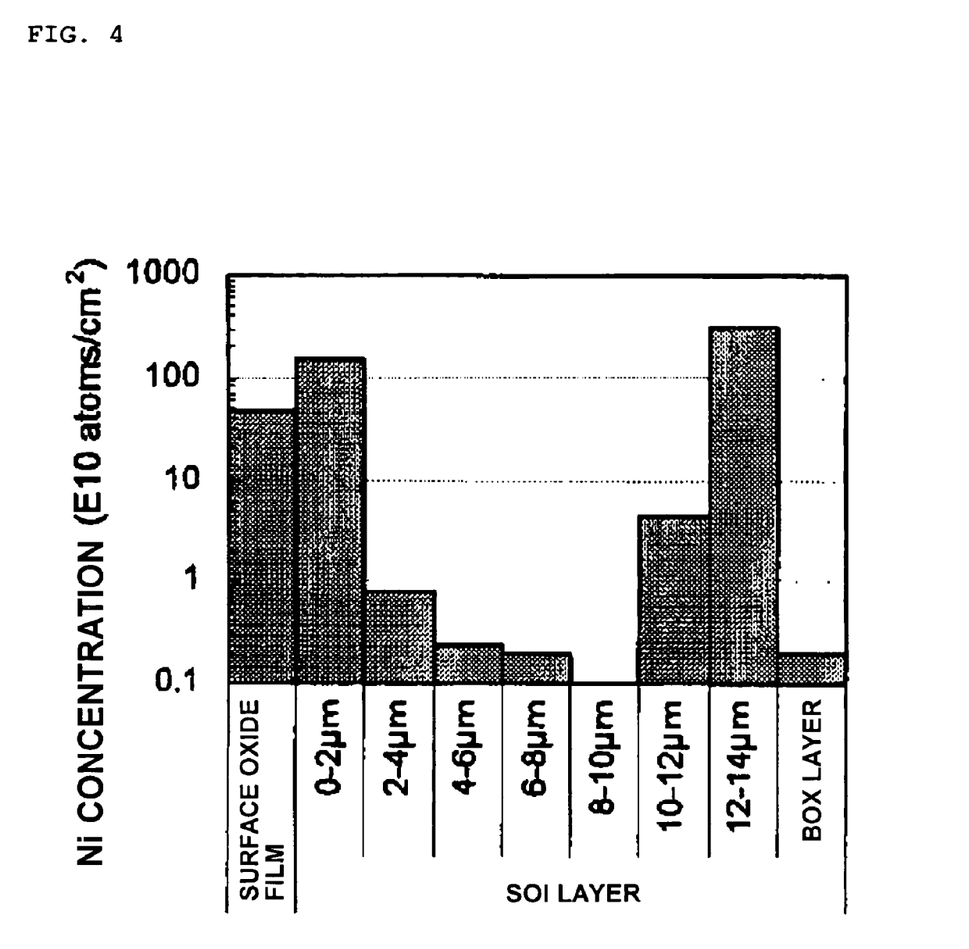
FIG. 4 is a graph showing an evaluation result of a gettering ability of an SOI substrate in Example 2.
Figure 5:
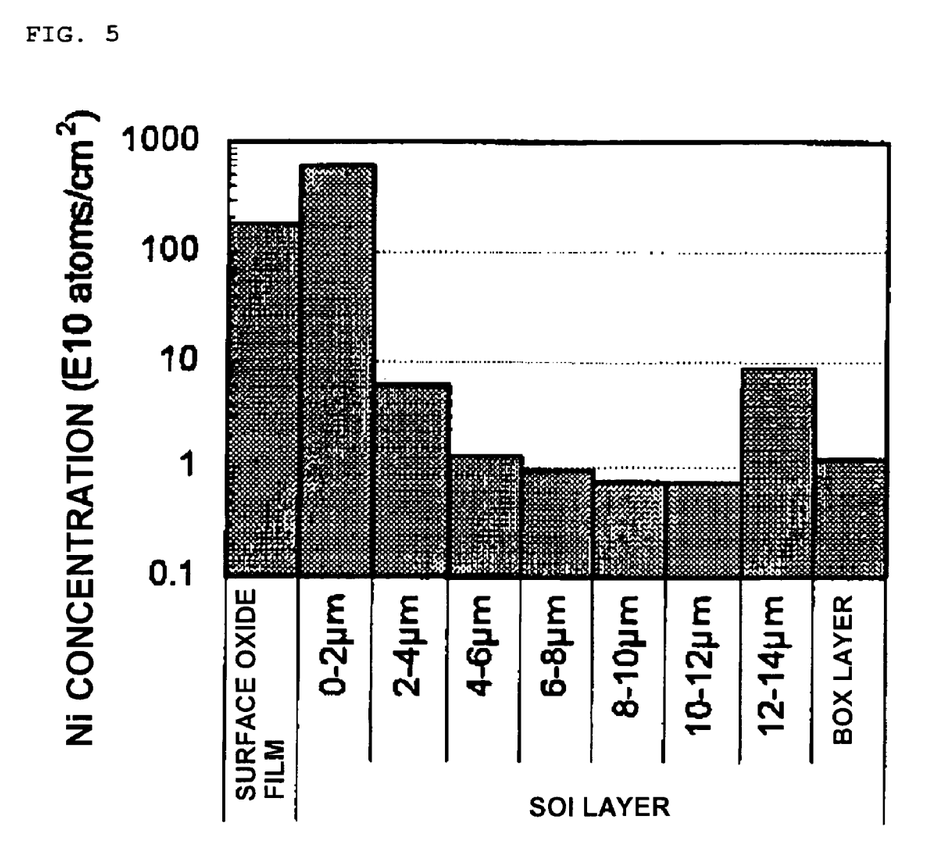
FIG. 5 is a graph showing an evaluation result of a gettering ability of an SOI substrate in Example 3.

Gettering abilities of the thus fabricated SOI substrates were evaluated by using the same method as that of the experimental example depicted in FIG. 2, and FIG. 4 (Example 2) and FIG. 5 (Example 3) show results.

Comparative Example 2

Figure 6:
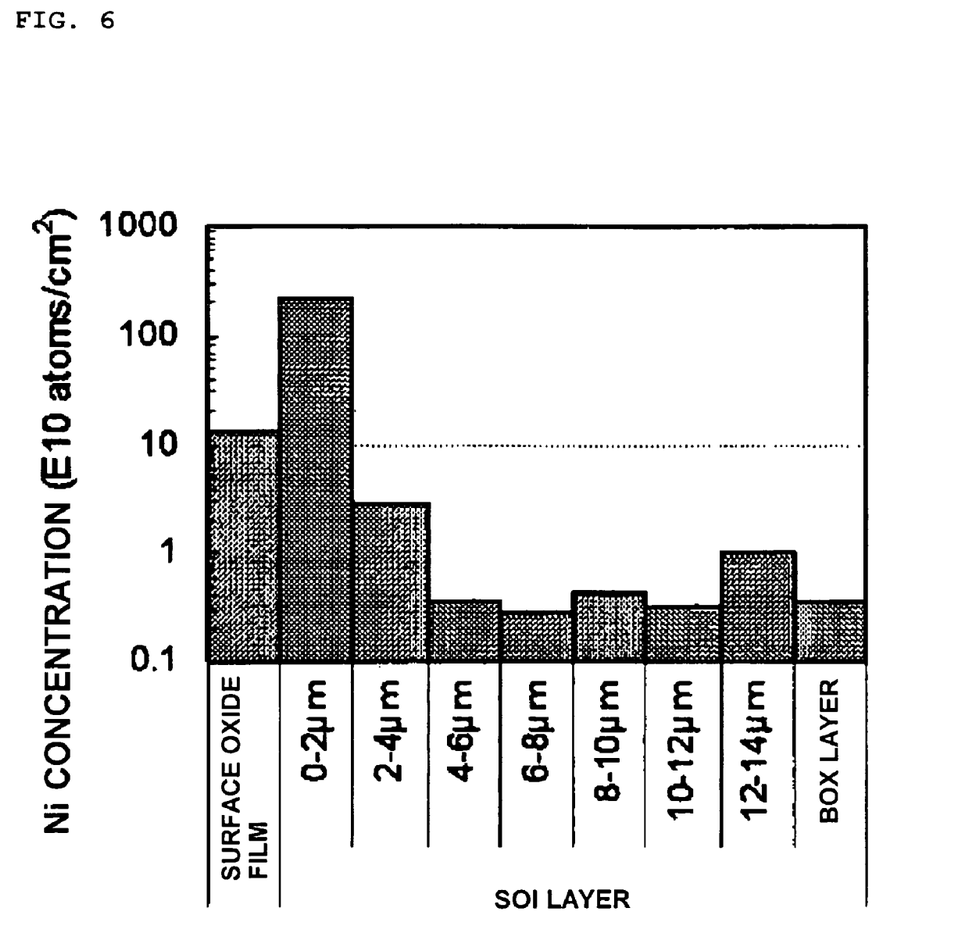
FIG. 6 is a graph showing an evaluation result of a gettering ability of an SOI substrate in Comparative Example 2.

An SOI substrate was fabricated in a state where a heat treatment at 1150° C. for 2 hours alone was performed as the bonding heat treatment without carrying out holding at 1000° C. for 2 hours in the procedure for fabricating the SOI substrate according to Example 3, evaluation was performed by using the same method as that of Example 3, and FIG. 6 shows its result.

The following can be said based on the results of Examples 2 and 3 and Comparative Example 2.

It can be understood that, when the bonding heat treatment is performed in the atmosphere containing water vapor like Example 2, an Ni concentration gettered near an interface of the SOI layer and the BOX layer shows a value that is at least one digit higher than that obtained when the heat treatment is performed in the atmosphere containing no water vapor like Example 3, and that the further excellent gettering ability is provided. Although a reason that the gettering ability is increased when the bonding heat treatment is performed in the atmosphere containing water vapor in this manner is not clear, it can be considered that presence of water molecules each having a smaller molecular radius than an oxygen molecule concerns formation or maintenance of a defect near the interface.

On the other hand, it can be understood that, even when the heat treatment is performed in the atmosphere containing no water vapor like Example 3, carrying out the bonding heat treatment based on the heat treatment method involving holding during the process according to the present invention causes the Ni concentration gettered near the interface between the SOI layer and the BOX layer to demonstrate a value that is approximately one digit higher than that obtained by the heat treatment method involving no holding during the process like Comparative Example 2, thereby providing the gettering ability.

Therefore, performing the bonding heat treatment according to the present invention in the atmosphere containing water vapor is preferable in order to obtain the higher gettering ability. However, since the atmosphere containing water vapor has a high oxidation rate, applying this atmosphere to, e.g., a thin-film SOI wafer fabricated by using the ion implantation and delamination method increases a reduction amount of a film thickness of the SOI layer, and a desired SOI layer thickness cannot be obtained in some cases. When using the atmosphere containing water vapor is difficult like this case, performing the bonding heat treatment according to the present invention in the atmosphere containing no water vapor is effective.

It is to be noted that the present invention is not restricted to the foregoing examples. The above examples are just exemplifications, and any examples that have substantially the same structures as the technical concepts explained in claims according to the present invention and demonstrate the same functions and effects are included in the technical scope of the present invention.

For example, although surface grinding or mirror polishing is performed as the process for reducing a film thickness of the bond wafer after bonding in the examples, a method called the ion implantation and delamination method may be used to reduce a film thickness of the bond wafer instead.

Additionally, a temperature held during heating on the first stage in the bonding heat treatment can vary with time within its temperature range as long as the range of at least 950° C. to 1100° C. is maintained.

The invention claimed is:

1. A method for manufacturing an SOI substrate based on a bonding method, comprising at least: forming a silicon oxide film on a surface of at least one of a single-crystal silicon substrate that becomes an SOI layer and a single-crystal silicon substrate that becomes a support substrate; bonding the single-crystal silicon substrate that becomes the SOI layer to the single-crystal silicon substrate that becomes the support substrate through the silicon oxide film; and performing a heat treatment for holding at a temperature falling within the range of at least 950° C. to 1050° C. and then carrying out a heat treatment at a temperature higher than 1100° C. when effecting a bonding heat treatment for increasing bonding strength.

2. The method for manufacturing an SOI substrate according to claim 1, wherein the silicon oxide film is formed on a surface of the single-crystal silicon substrate that becomes the support substrate.

3. The method for manufacturing an SOI substrate according to claim 1, wherein a time for holding at the temperature in the range of 950° C. to 1050° C. is set to the range of 1 hour to 4 hours.

4. The method for manufacturing an SOI substrate according to claim 2, wherein a time for holding at the temperature in the range of 950° C. to 1050° C. is set to the range of 1 hour to 4 hours.

5. The method for manufacturing an SOI substrate according to claim 1, wherein the heat treatment for increasing bonding strength includes a heat treatment in an atmosphere containing water vapor.

6. The method for manufacturing an SOI substrate according to claim 2, wherein the heat treatment for increasing bonding strength includes a heat treatment in an atmosphere containing water vapor.

7. The method for manufacturing an SOI substrate according to claim 3, wherein the heat treatment for increasing bonding strength includes a heat treatment in an atmosphere containing water vapor.

8. The method for manufacturing an SOI substrate according to claim 4, wherein the heat treatment for increasing bonding strength includes a heat treatment in an atmosphere containing water vapor.

* * * * *